United States Patent [19]

Teva

[11] Patent Number: 5,391,965
[45] Date of Patent: Feb. 21, 1995

[54] GAS DISCHARGE IGNITION DEVICE AND METHOD USING HIGH FREQUENCY AND HIGH POWER TO IGNITE A UNIFORM ELECTRODE SURFACE AREA

[76] Inventor: Gil Teva, 7 Havazelet Street, Jerusalem, Israel

[21] Appl. No.: 57,097

[22] Filed: May 5, 1993

[51] Int. Cl.⁶ .............................................. H05B 41/16
[52] U.S. Cl. .................... 315/137; 315/169.1; 315/111.21; 315/58
[58] Field of Search ............... 315/169.1, 165, 137, 315/58, 111.21; 313/231.3, 231.5

[56] References Cited

U.S. PATENT DOCUMENTS 3,746,420  7/1973  Baker et al. .................. 315/169.4 X
3,925,703 12/1975  Schermerhorn ................. 315/169.4
3,962,597  6/1976  Clark et al. ..................... 315/58 X
4,502,145  2/1985  Allen et al. ..................... 315/137 X
4,517,495  5/1985  Piepmeier ....................... 315/137 X Primary Examiner—Robert J. Pascal
Assistant Examiner—Haissa Philogene
Attorney, Agent, or Firm—Hana Dolezalova

[57] ABSTRACT

A device and method for establishing and maintaining a gas discharge extending essentially through the entire space between electrodes which face each other. The gas discharge is obtained by providing on at least one of the surfaces of the electrodes facing each other a thin dielectric coating, and applying a suitable current, in the range of from about 50 KHz to about 2 MHz. A high frequency excitation voltage is used, and the thin dielectric coating acts as a capacitor.

18 Claims, 2 Drawing Sheets

GAS DISCHARGE IGNITION DEVICE AND METHOD USING HIGH FREQUENCY AND HIGH POWER TO IGNITE A UNIFORM ELECTRODE SURFACE AREA

FIELD OF THE INVENTION:

There are provided gas discharge means where the gas discharge extends between essentially the entire area of surfaces facing each other. There is also provided a method for establishing and maintaining such gas discharges.

There are further provided a variety of devices, lasers, UV xenon lamps, systems for vapor deposition etc.

BACKGROUND OF THE INVENTION

The voltage required to induce a gas discharge is generally higher than that required for maintaining such a discharge. Generally when a high frequency voltage is applied to parallel metallic electrodes, the resulting discharge occurs only through a quite small part of the volume of the gaseous medium. After the start of the discharge the voltage drops to a lower value, and the discharge will not spread to a greater part of the volume. Hitherto, in order to obtain a gas discharge through a large part of the volume of the gas between electrodes, there are used ballast resistors, radio frequency excitation, magnetic field excitation, reactive coil excitation and the like. In *Lasers and Optronics*, May 1988, 20-21 there is described a laser operated by DC voltage magnetic field and ballast resistors, which ballast resistors ensure that the electrodes will be at a high voltage in case that no ignition occurs. After such ignition, the voltage difference between the power supply and the electrode voltage drops on the resistor.

Other lasers are operated by the use of a radio frequency voltage, resulting in a discharge over the full length. High power carbon dioxide lasers are excited by a radio frequency voltage applied to parallel elongated metallic electrodes. In such systems, when the frequency is lower than about 10 MHz, the discharge tends to arc and to take place only along a small section of the length of the electrodes. Generally power supply means required are rather expensive, resulting in a high cost of the entire system.

SUMMARY OF THE INVENTION

There is provided a method for establishing and maintaining a gas discharge between substantially the entire surfaces of two electrodes facing each other, where at least one of the surfaces, and preferably both, of such surfaces are provided with a coating of a dielectric coating. There is used a high frequency excitation voltage, and the thin dielectric coating acts as capacitor, between the metallic electrode and the gaseous medium. These act in a manner similar to that of ballast resistors, and at a high frequency voltage there exists an impedance. The voltage difference between the power supply and the gas discharge drops on the capacitors. If no gas discharge is established through part of the surface facing each other, no current passes through this part of the gas, and there is no voltage drop on the capacitor, resulting in a voltage of the gas equal to that of the power supply connected to the electrodes, and this is generally adequate to start the gas discharge. After ignition, the gas voltage will be lower than that of the power supply and the dielectric coating absorbs the voltage difference.

Discharges according to the present invention can be established at frequencies from about 50 KHz to about 2 MHz, the preferred range being about 100 KHz to about 800 KHz, requiring comparatively inexpensive power supply means.

The dielectric coating applied to the metal electrode or electrodes facing each other is thin, generally of the order of from about 30 microns to about 80 microns, having a high breakdown voltage, and advantageously a high thermal mobility, which is important for the cooling of the gas for certain applications, such as high power lasers. Substances such as aluminum oxide are suitable as dielectric coating, and voltages will be generally in the 500 V to about 2000 V range. There can be used polyphase voltage, applied to 3 or more electrodes. The discharge can be between essentially planar electrodes. It can also have a variety of other configurations, such as a discharge in the space between two tubular electrodes of different diameter, where at least one of the surfaces facing each other is coated with a dielectric coating.

For certain applications, it is advantageous to provide means for cooling the gas or for replacing it with a cold gaseous medium. The electrodes can be coated with a highly reflective coating, which may be the dielectric coating, or which may constitute an additional coating of the electrode. Amongst possible coatings there may be mentioned high polymer coatings such as Teflon TM.

Amongst devices based on the use of large-volume gas discharges of the present invention there may be mentioned, by way of example, high power lasers, He—Cu ion metal sputtering laser system, vapor deposition devices, gas analysis systems, UV xenon lamps, means for the deposition of carbon vapor, vapor deposition systems for deposition on optical elements and the like.

Due to the fact that the preferred range of frequencies is about 100 KHz to about 800 KHz, there can be used comparitively inexpensive power supply means. The cost of a power supply for this frequency range of about 5 KW is in the range of about $500.00, where as a radio frequency power supply of the same power rating costs at least ten times as much.

Such, and similar devices will have the conventional configurations, the difference being that there is established a gas discharge through a predetermined volume of the gaseous medium, between electrodes facing each other or in other suitable positions.

BRIEF DESCRIPTION OF THE DRAWINGS

The invention is illustrated with reference to the enclosed Figures, which are not according to scale, and in which:

As shown in FIG. 1, there are provided two rectangular electrodes 11 and 12, connected with Power supply 13, which supplies a 100,000 Hz current at 300 V, and which results in a gas discharge only in the volume defined by 14, between the two electrodes. As shown in FIG. 2, there are provided two rectangular electrodes 21 and 22, facing each other, each of these being provided with a dielectric coating 23 and 24, respectively, which electrodes are connected with Power supply 25, of 560 V and 100 KHz. There is established a gas discharge throughout the entire space 26, between the electrodes. FIG. 3 illustrates a circuit equivalent to that of FIG. 2, and here there are provided two electrodes 31 and 32, facing each other, and capacitors 33 and 34, shown as two alternatives, on the left hand side and the right hand side of the electrodes. 1) Without discharge, (at right side). 2) with discharge, (at left side) an example is given using realistic values. The gas has an ignition voltage of 500 volts and after ignition the voltage is 300 volts. When discharge does not occur (pictured on the right side) there is no current and the voltage of the capacitors is zero. The gas voltage is 560 volts and is higher than the ignition voltage. The gas will start to ignite. After ignition, as shown on the left hand side, the gas voltage is 300 volt and the voltage of each capacitor is 130 volt. The capacity of the coating has a value of 700 picofarads per square centimeter and the frequency is 100,000 Hz and the reactance of the capacitor is 2000 OHMS. The power is 20 watts per square centimeter.

DESCRIPTION OF THE PREFERRED EMBODIMENT

A system was set up, comprising two aluminum tubes, of 6 mm diameter, and 350 mm length, parallel with each other with a distance of 3.5 mm between the aluminum tubes which served as electrodes. Between these there was maintained a gas atmosphere of 12.5% carbon dioxide, 12.5% nitrogen, and 75% helium, as used with carbon dioxide lasers. The pressure was 50 millibar. The electrodes were coated with a 50 microns thick aluminum oxide coating, and the capacity of the coating was 700 picofarad per square centimeter. A sinusoidal voltage 1000 volts R.M.S. at a frequency of 700,000 hertz was applied to the electrodes. The power was 300 watts there was a discharge over the full length of the electrodes;, there were no optimization steps needed to achieve this result, and it was at the ignition of the power supply.

When using non-coated electrodes the discharge was 5 millimeters long. Many other setups showed similar results. The pressure can be from 1 millibar to 10,000 millibars, with a frequency from 10 KHz to about 1 MHz.

Various gases and gas mixtures can be used. The electrodes can be elongated or have a brick shape. Annular electrodes can be used, forming an annular discharge. More than two electrodes can be used, supplied with single phase voltage or polyphase voltage. When two electrodes excite the gas, one electrode can be coated and the other can be uncoated. The ballast voltage will fall on the coated electrode only and the effect will be similar. The electrodes can be made from many metals and the coatings can be made of many dielectric materials, having thickness between 10 to 200 microns. For high power applications, materials with high thermal mobility can be chosen. High optical reflectivity coatings can be used, and also polished coatings.

Figure 1:
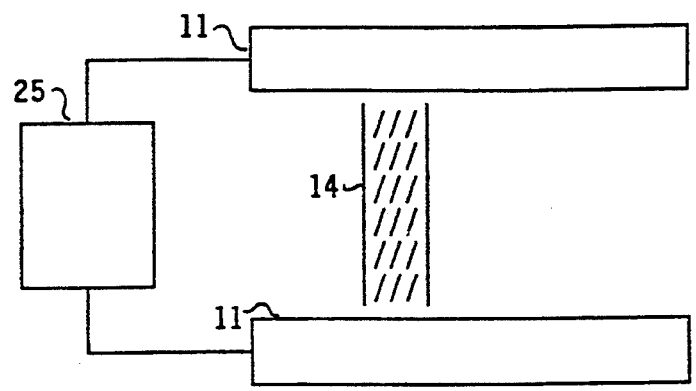
FIG. 1 is a sectional schematic side view through a gas discharge system of conventional design.
Figure 2:
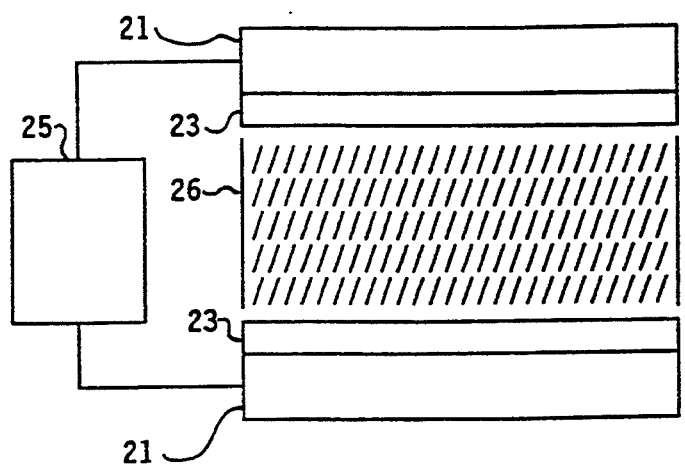
FIG. 2 is a schematical sectional side view of a gas discharge system of the invention.
Figure 3:
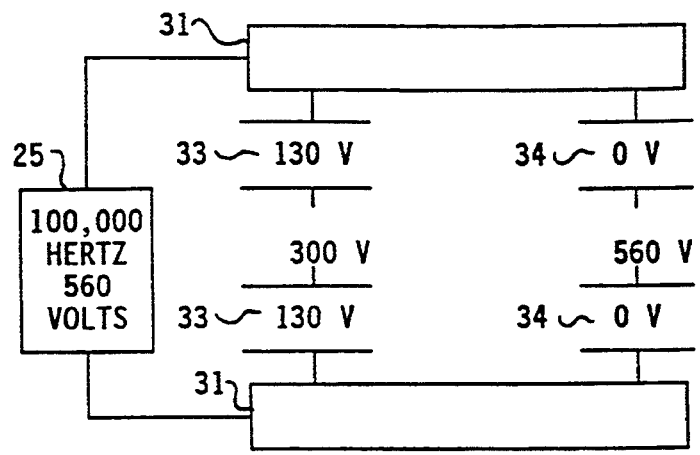
FIG. 3 is a schematical sectional side view of a gas discharge arrangement of conventional design which is an equivalent of the novel design of FIG. 2.
Figure 4:
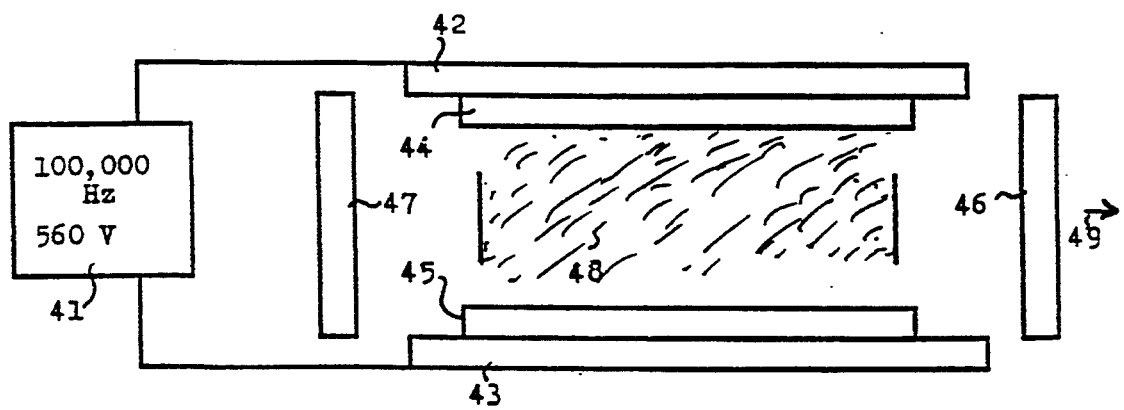
FIG. 4 is a schematic side view, not according to scale, of a laser based on a gas discharge according to the present invention.

One of the many possible uses of gas discharges according to the present invention is that of a laser. This is illustrated in FIG. 4:

As shown in FIG. 4, there is provided a Power supply 41, connected with the two electrodes 42 and 43, respectively, each of which is coated with a dielectric coating 44 and 45, respectively. There is provided a semi-transparent mirror 46 and a fully reflecting mirror 47, when a suitable power, in the frequency range defined above, is applied to the dielectric-coated electrodes, there is established a gas discharge which is confined in the entire space 48, with lasing resulting as laser beam 49.

I claim:
1. A gas discharge device for establishing and maintaining an uniform electric discharge of gas between two or more electrodes facing each other, comprising:
   a) a plurality of metallic electrodes having a thickness in the range of about 0.1 to about 1 cm, wherein at least one of said electrodes is coated with a dielectric material coating having a thickness of 10-200 microns, wherein said electrodes are held in substantially parallel relation to each other and wherein each electrode comprises a surface area facing the other electrode;
   b) means for providing a gas atmosphere having a gaseous pressure from about 10 to about 10,000 millibars within which said electrodes are contained; and
   c) means for supplying said electrodes with a voltage between about 500 and 2000 volts at a frequency of 50,000–1,000,000 hertz and power of at least 1 watt per square centimeter of the electrode area.
2. The device according to claim 1, wherein the gas atmosphere is formed by a mixture of carbon dioxide, nitrogen and helium.
3. The device according to claim 1 wherein the metallic electrode is an aluminum electrode.
4. The gas discharge according to claim 1, wherein the dielectric coating has high thermal mobility.
5. The gas discharge according to claim 1, wherein the coating is reflective.
6. The device according to claim 1, where the coating is aluminum oxide or teflon.
7. The device according to claim 1, additionally comprising means for cooling of the electrodes by fluid.
8. The device according to claim 7 wherein the cooling is by a cold gaseous medium.
9. The device according to claim 1, where there are three or more electrodes and the voltage is a polyphase voltage.
10. The device according to claim 1 wherein the electrodes are annular and the gas discharge is annular.
11. A method for establishing and maintaining uniform gas discharge between the entire area of electrode surfaces facing each other, comprising the steps of:
   a) coating at least one metallic electrode with a dielectric material coating having from about 10 to about 200 microns thickness;
   b) placing and holding a plurality of metallic electrodes, at least one of which is coated as in step (a), in substantially parallel relation to each other, wherein said coated electrode faces a second electrode;
   c) containing said electrodes of step (b) in a gas atmosphere under a gaseous pressure of 10–10,000 millibars; and
   d) supplying said electrodes with about 500 to about 200 voltage having a frequency of 50,000–1,000,000 hertz and with a power of at least 1 watt per square centimeter of the electrode area.

12. The method according to claim 11, wherein the gas atmosphere is a mixture of carbon dioxide, nitrogen and helium.

13. The method according to claim 11, wherein the metallic electrode is an aluminum electrode.

14. The method according to claim 11, wherein the dielectric coating has high thermal mobility.

15. The method according to claim 11, wherein the coating is reflective.

16. The method according to claim 11, where the coating is aluminum oxide or teflon.

17. The method according to claim 11, additionally comprising means for cooling of the electrodes by fluid.

18. The method according to claim 17 wherein the cooling is by a cold gaseous medium.

* * * * *